United States Patent
Boecking

(10) Patent No.: US 6,464,202 B1
(45) Date of Patent: Oct. 15, 2002

(54) VALVE FOR CONTROLLING LIQUIDS

(75) Inventor: Friedrich Boecking, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/856,839

(22) PCT Filed: Sep. 16, 2000

(86) PCT No.: PCT/DE00/03229
§ 371 (c)(1),
(2), (4) Date: May 25, 2001

(87) PCT Pub. No.: WO01/23746
PCT Pub. Date: Apr. 5, 2001

(30) Foreign Application Priority Data

Sep. 30, 1999 (DE) .......................... 199 46 838

(51) Int. Cl.⁷ .............................................. F16K 31/02
(52) U.S. Cl. ............................. 251/129.06; 251/30.02; 251/335.2
(58) Field of Search ................... 251/129.06, 30.02, 251/335.2

(56) References Cited

U.S. PATENT DOCUMENTS

| | | | |
|---|---|---|---|
| 3,919,989 A | * 11/1975 | Jarrett et al. ................. | 123/447 |
| 4,560,871 A | * 12/1985 | Bowman et al. ............... | 251/57 |
| 4,593,658 A | * 6/1986 | Moloney ................ | 251/129.04 |
| 5,314,164 A | * 5/1994 | Smith ....................... | 251/335.2 |
| 5,343,894 A | * 9/1994 | Frisch et al. ........... | 251/129.06 |
| 5,772,179 A | * 6/1998 | Morinigo et al. ......... | 251/129.2 |
| 5,779,218 A | * 7/1998 | Kowanz ................. | 251/129.06 |
| 6,257,548 B1 | * 7/2001 | Hiddessen et al. ...... | 251/129.06 |

FOREIGN PATENT DOCUMENTS

| | | |
|---|---|---|
| DE | 196 46 511 C | 5/1998 |
| DE | 197 24 637 A | 12/1998 |
| EP | 0 477 400 A | 4/1992 |

* cited by examiner

Primary Examiner—Lesley D. Morris
Assistant Examiner—John Bastianelli
(74) Attorney, Agent, or Firm—Michael J. Striker

(57) ABSTRACT

A valve (1) for controlling fluids is provided with a valve member (2), which is axially displaceable in a bore (5) of a valve body (3) and has a valve head (6), forming a valve closing member, that cooperates with a seat (7), provided on the valve body (3), for opening and closing the valve (1). A piezoelectric unit (4) for actuating the valve member (2) and a tolerance compensating element (12) for compensating for elongation tolerances of the piezoelectric unit (4) and/or other valve components (3) are also provided. The piezoelectric unit (4) is disposed in terms of its action direction essentially at a right angle to the axial direction of motion of the valve member (2) and can be acted upon by electric current such that the piezoelectric unit (4) exerts a tilting motion on a control member (12) that serves as a lever arm and is operatively connected to the valve member (2).

10 Claims, 1 Drawing Sheet

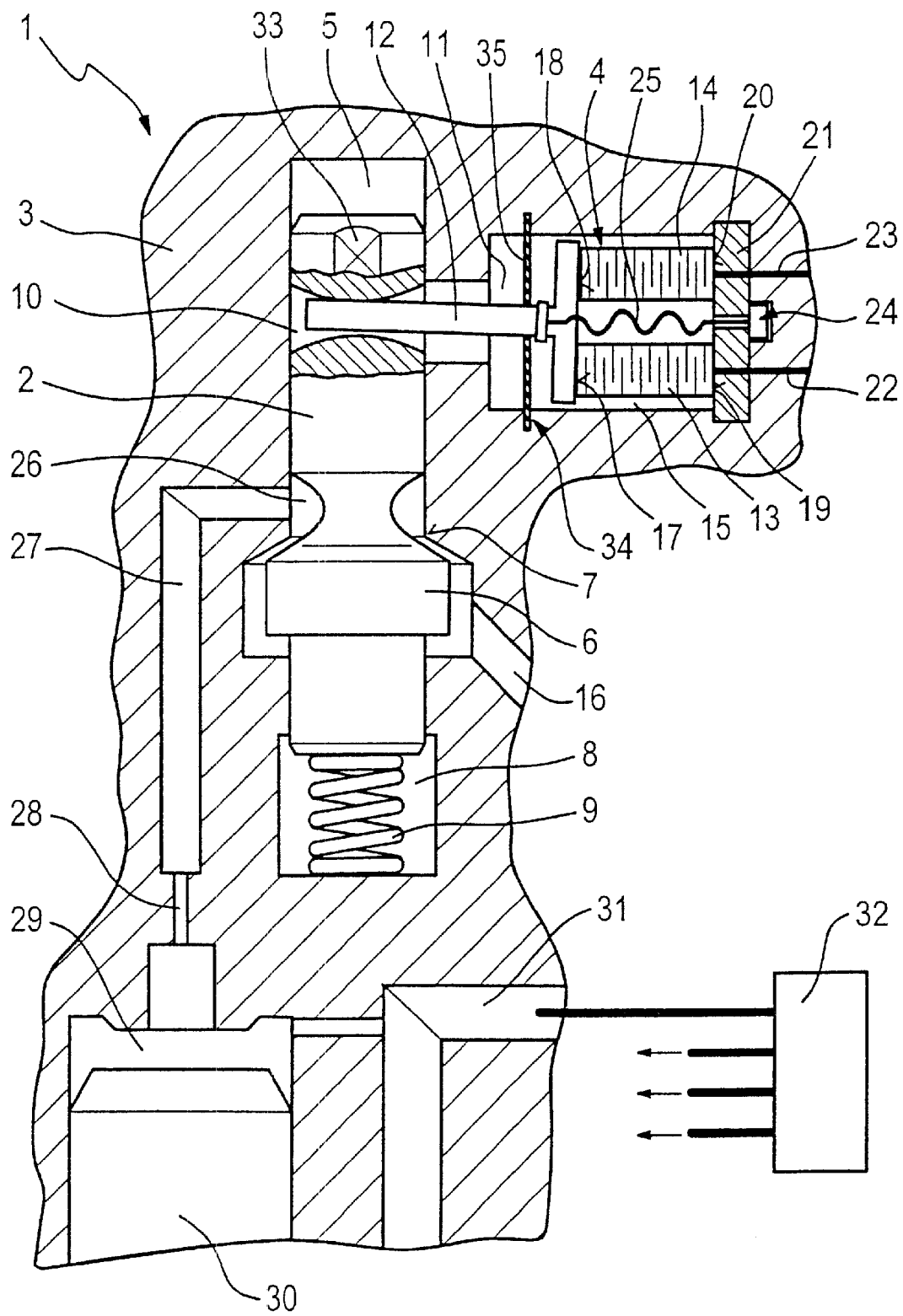

VALVE FOR CONTROLLING LIQUIDS

PRIOR ART

The invention is based on a valve for controlling fluids as generically defined by the preamble to claim 1.

From European Patent Disclosure EP 0 477 400 A1, an arrangement for a valve of this generic type is known in which the deflection of the piezoelectric actuator is transmitted via a hydraulic chamber. An adaptive, mechanical tolerance compensation, acting in the stroke direction, for a travel transformer of the piezoelectric actuator is provided.

In the known arrangement, the hydraulic chamber functions as a so-called hydraulic step-up means. The hydraulic chamber encloses a common compensation volume between two pistons defining this chamber, of which one piston is embodied with a smaller diameter and is connected to a valve member to be triggered, and the other piston is embodied with a larger diameter and is connected to the piezoelectric actuator.

The valve member, piston and piezoelectric actuator are located one after the other on a common axis.

The hydraulic chamber is fastened between the two pistons in such a way that the actuating piston of the valve member, which piston is retained in its position of repose by means of one or more springs relative to a predetermined position, executes a stroke that is increased by the step-up ratio of the piston diameter when the larger piston is moved a certain travel distance by the piezoelectric actuator.

The compensation volume of the hydraulic chamber makes it possible for tolerances caused by temperature gradients in the component or different coefficients of thermal expansion of the materials used and possible settling effects to be compensated for without causing a change in position of the valve member to be triggered.

Compensating for changes in length of the piezoelectric actuator, the valve member or the valve housing by means of the hydraulic chamber disposed between two pistons requires a complicated construction, however, and is problematic in terms of the incident leakage losses and the refilling of the hydraulic chamber.

From German Patent DE 196 46 511 C1, a drive or adjusting element of the piezoelectric actuator type is known which is used to generate tilting motions in high frequency ranges. In the drive or adjusting element, a first and a second region of piezoelectrically active material are provided, these two regions communicating with one another via a third region. The third region is of piezoelectrically passive material. Applying a voltage, for instance to the first region of the drive element, correspondingly expands this region expanded in its longitudinal direction, resulting in a corresponding bending along the axis of symmetry of the entire piezoelectric drive element. A reversal of the bending or tilting angle of the drive element can be achieved by applying a voltage to the second region of the drive element.

The object of the invention is to create a valve for controlling fluids in which an arrangement with a piezoelectric unit and a tolerance compensation is provided that has a simple structural design with as few components as possible and requiring little space.

ADVANTAGES OF THE INVENTION

The valve for controlling fluids of the invention as defined by the characteristics of the body of claim 1 has the advantage that by the cooperation of the control member and the piezoelectric unit, triggering of the valve is achieved without an additional tolerance compensating element for elongation tolerances, in particular temperature-dictated elongation tolerances.

In the valve of the invention, the control member acting as a lever arm is connected to the piezoelectric unit in such a way that when electric current is imposed on only one piezoelectric actuator, the control member is tilted relative to its longitudinal direction by the resultant lengthwise expansion. Thus in a sense the control member acts as a tilt lever. Depending on the direction of tilt of the control member, the valve member connected to the control member is correspondingly moved in the longitudinal bore of the valve body. The valve member thus executes a reciprocating motion, as a result of which the valve is put into the closing or opening position.

As a result of temperature changes, both piezoelectric actuators expand approximately equally, so that the control member, which is disposed approximately at a right angle to the direction of motion of the valve member, advantageously causes no reciprocating motion of the valve member. Thus temperature-dictated elongation tolerances, in particular, have no influence on the control of the valve.

Because in the valve of the invention it is possible to dispense with an additional temperature compensating element, an advantageously simple structural design of the valve is possible.

The valve of the invention is especially well suited to use as a fuel injection valve. However, it is understood that still other fields of use are possible, in which valves with high frequency triggering are required.

Further advantages and advantageous features of the subject of the invention can be learned from the description, drawing and claims.

DRAWING

One exemplary embodiment of the valve for controlling fluids of the invention is shown in the drawing and will be described in further detail below.

The sole drawing FIGURE shows a schematic, fragmentary view of one exemplary embodiment of the invention, in a fuel injection valve for internal combustion engines, in longitudinal section.

DESCRIPTION OF THE EXEMPLARY EMBODIMENT

The exemplary embodiment shown in the drawing illustrates a use of the valve of the invention in a fuel injection valve 1 for internal combustion engines of motor vehicles. In the present case, the fuel injection valve 1 is embodied as a common rail injector.

To adjust an injection onset, duration of injection, and injection quantity by way of force ratios in the fuel injection valve 1, a valve member 2 disposed in a valve body 3 is triggered via a piezoelectric unit 4 with a piezoelectric actuator 4.

The pistonlike valve member 2 is disposed axially displaceably in a bore, embodied as a longitudinal bore 5, of the valve body 3, of the fuel injection valve 1, and on its lower end, toward the combustion chamber, it has a valve head 6 forming a valve closing member. The valve head 6 cooperates with a seat 7, embodied on the valve body 3, and in the raised state of the valve head 6, a communication is established with a spring chamber 8 having a spring 9 that exerts a restoring force on the outward-opening valve head 6.

In the region of the valve head 6, the longitudinal bore 5 of the valve body 3 is widened in terms of its diameter. The widened region of the longitudinal bore 5 has a leakage drain line 16, through which fuel, which has flowed through the longitudinal bore between the valve head 6 and the seat 7, is carried away.

The upper end, remote from the valve head 6, of the valve member 2 has a recess 10, extending transversely to the direction of motion of the valve member 2, for receiving a control member 12. In the drawing, the recess 10 is represented as a bore extending through the valve member 2. It is understood that other shapes of the recess 10 are also possible. To provide fluid compensation between the recess 10 and a volume on the end of the longitudinal bore 5 in the valve body 3 remote from the combustion chamber, a corresponding flat face 33 is provided on the valve member 2.

At the level of the recess 10, the valve body 3 has a transverse bore 11, which extends transversely to the longitudinal bore 5 and discharges into it and which widens to a larger diameter. The piezoelectric unit 4 with the control member 12 acting as a lever arm is disposed in the transverse bore 11. One end of the control member 12 is received in the recess 10 of the valve member 2. The other end of the control member 12, toward the piezoelectric unit 4, is connected to the piezoelectric unit.

In an alternative version, the control member 12 and the piezoelectric unit 4 can be accommodated in a separate housing. The housing could for instance be connected to the valve body 3. In an alternative version, it could also be provided that the valve member 2 is embodied in two pieces in the region of the recess 10, in which case a recess is provided on the bearing faces of both pieces of the valve member 2.

The piezoelectric unit 4 has two piezoelectric actuators 13, 14, disposed parallel to one another, which are located approximately at a right angle to the direction of motion of the valve member 2. The piezoelectric actuators 13, 14, comprising multiple parallel layers, are disposed in a piezoelectric chamber 15. It is understood that the number of piezoelectric actuators used could readily also be other than two.

The piezoelectric actuators 13, 14 have head portions 17, 18 and foot portions 19, 20. The head portions 17, 18 of the piezoelectric actuators 13, 14 are connected to the end toward them of the control member 12. The foot portions 19, of the piezoelectric actuators 13, 14 are in contact with a support 21, and each of the foot portions 19, 20 have respective contacting means 22, 23 for supplying current to the piezoelectric actuators 13, 14.

To achieve the longest possible stroke, the piezoelectric actuators 13, 14 are constructed of multiple thin layers, using the "multilayer" mode of construction known per se. So that these layers will not separate from one another when current is supplied to the piezoelectric actuators 13, 14, the layers must be prestressed, and the force to be brought to bear can amount to approximately 1000 N.

To that end, the piezoelectric actuators 13, 14 disposed between the control member 12 and the support 21 are pressed together by a prestressing element 24. In the version shown, the prestressing element 24 is embodied with a tension member 25. It is understood that other prestressing elements can alternatively be used, such as hydraulic, mechanical or similar prestressing elements.

Between the longitudinal bore 5 of the valve body 3 and the piezoelectric actuators 13, 14, a sealing device 34 is provided, which is intended to prevent the fuel located in the longitudinal bore 5 from coming into contact with the piezoelectric unit 4. The sealing device 34 is embodied as a diaphragm 35 in the drawing. The diaphragm 35 extends across the full diameter of the transverse bore 11 and rests with positive engagement on the control member 12. It is understood that still other structural designs of the sealing device 34 are also possible.

Above the seat 7 of the valve body 3, the valve member 2 has a constriction 26 that is approximately parabolic in cross section. In the region of the apex of the parabolic constriction 26, the longitudinal bore 5 of the valve body 3 is adjoined by a drain line 27, extending radially to the longitudinal bore 5 and having a drain throttle 28. The drain line 27 discharges into a valve control chamber 29 that adjoins it toward the combustion chamber. A movable valve control piston 30, shown only in fragmentary form in the drawing, is disposed in the valve control chamber 29. By axial motions of the valve control piston 30 in the valve control chamber 29, an injection valve, not otherwise shown, of the fuel injection valve 1 is controlled.

Also discharging into the valve control chamber 29 is an injection line 31, which supplies the injection nozzle with fuel. The injection line 31 communicates with a high-pressure storage chamber (common rail) 32 that is common to a plurality of fuel injection valves. The common rail 32 is supplied in a known manner with fuel at high pressure from a tank by a high-pressure fuel feed pump.

The fuel injection valve 1 shown in the drawing functions as follows:

The piezoelectric actuators 13, 14 disposed one above the other are subjected to electric current in alternation, so that the control member 12, because of the expansion in length of one of the two piezoelectric actuators 13, 14, functions more or less as a tilt lever and causes the valve member 2 to execute corresponding reciprocating motions in the longitudinal bore 5 of the valve body 3.

For closing the fuel injection valve 1, current is supplied to the lower piezoelectric actuator 13, as a result of which an abrupt expansion of this piezoelectric actuator is achieved transversely to the direction of motion of the valve member 2; the foot portion 19 of the piezoelectric actuator 13 is braced on the support 21. The elongation of the actuator 13 causes the control member 12 to function like a tilt lever, and the valve member 2 is moved axially upward in the longitudinal bore 5 by the control member 12. As a result, the valve head 6, acting as a valve closing member, of the valve member 2 is put into contact with the seat 7 assigned to it, so that no fluid, or in the case of the fuel injection valve 1 shown no fuel, can flow from the valve control chamber 29 communicating with the common rail 32 to reach the region of the longitudinal bore 5.

The spring 9 disposed in the spring chamber 8 additionally acts as a sealing spring, since it too presses the valve head 6 of the valve member 2 against the seat 7 provided on the valve body 3. The spring 9 thus keeps the valve member 2 in the closed position, even when current is no longer supplied to the lower piezoelectric actuator 13. In a force-compensated version of the fuel injection valve 1, as in the present case, the spring 9 can be made correspondingly small in size.

When an injection through the fuel injection valve 1 is to take place, only the upper piezoelectric actuator 14 is supplied with current, and as a result it expands suddenly transversely to the direction of motion of the valve member 2, the foot portion 20 of the piezoelectric actuator 14 also being braced on the support 21. The change in length thus causes the control member 12, acting as a lever arm, to execute an opposed tilting motion this time, since only the upper piezoelectric actuator 14 is expanded. As a result, the valve member 2 is moved axially downward in the longitudinal bore 5 by the control member 12. The valve head 6 of the valve member 2 is raised from its seat 7 provided on the valve body 3 into an open position, counter to the spring force of the spring 9. Thus fuel from the valve control chamber 29 can enter the longitudinal bore 5 of the valve body 3 in the region of the drain line 27. The fuel that has entered can escape again through the leakage drain line 16.

As a result, the valve control piston 30 is moved upward in the valve control chamber 29, and fuel is injected through the now-uncovered injection nozzle into the combustion chamber, not other shown.

The piezoelectric actuators 13, 14, disposed transversely to the direction of motion of the valve member 2, are both expanded or shrunk uniformly upon a temperature-dictated change in length, and thus the control member does not execute any tilting motion. Because of the disposition of the control member 12 in the longitudinal bore 5 transversely to the direction of motion of the valve member 2, it is sufficient, to achieve the tolerance compensation, for the control member 12 in the longitudinal bore to have an adequate axial play, which can optionally be increased further by means of an additional groove in the valve body 3.

It is thus assured that the temperature-dictated changes in length of the piezoelectric actuators 13, 14 have no effects overall on the closing and opening position of the valve member 2 and of the fuel valve 1.

What is claimed is:

1. A valve for controlling fluids, having a valve member (2), which is axially displaceable in a bore (5) of a valve body (3) and which has a valve head (6), forming a valve closing member, that cooperates with a seat (7), provided on the valve body (3), for opening and closing the valve (1), and having a piezoelectric unit (4) actuating the valve member (2), and having a tolerance compensating element (12) for compensating for elongation tolerances of the piezoelectric unit (4) and/or other valve components (3), characterized in that the piezoelectric unit (4), in terms of its action direction, is disposed substantially at a right angle to the axial direction of motion of the valve member (2) and can be acted upon by electric current in such a way that the piezoelectric unit (4) exerts a tilting motion on a control member (12) that serves as a lever arm and is operatively connected to the valve member (2).

2. The valve of claim 1, characterized in that the piezoelectric unit (4) has at least two piezoelectric actuators (13, 14), disposed parallel to one another, and the piezoelectric actuators (13, 14) can be acted upon by electric current in alternation.

3. The valve of claim 1, characterized in that the control member (12) is simultaneously intended as a tolerance compensating element to compensate for changes in length of the piezoelectric unit (4) transversely to the direction of motion of the valve member (2).

4. The valve of claim 2, characterized in that a first end of the control member (12) is connected to the valve member (2), and a second end of the control member (12) is connected to head portions (17, 18) of the piezoelectric actuators (13, 14).

5. The valve of claim 2, characterized in that the piezoelectric actuators (13, 14) are disposed one above the other, in terms of the direction of motion of the valve member (2), in a transverse bore (11) in the valve body (3), and a stop (21) for foot portions (19, 20) of the piezoelectric actuators (13, 14) is provided.

6. The valve of claim 5, characterized in that contacting means (22, 23) for supplying current to the piezoelectric actuators (13, 14) are provided on each of the foot portions (19, 20) of the piezoelectric actuators (13, 14).

7. The valve of claim 5, characterized in that the piezoelectric actuators (13, 14) are retained between the control member (12) and the stop (21), and that a prestressing element (27), connected to the control member (12) and the stop (21), for the piezoelectric actuators (13, 14) is provided.

8. The valve of claim 7, characterized in that the prestressing element (24) is embodied with a tension member (25).

9. The valve of claim 1, characterized in that a sealing device (34) is provided between the longitudinal bore (5) of the valve body (3) and the piezoelectric unit (4).

10. The valve of claim 9, characterized in that the sealing device (34) is embodied with a diaphragm (35).

* * * * *